US005590082A

United States Patent [19]
Abe

[11] Patent Number: 5,590,082
[45] Date of Patent: Dec. 31, 1996

[54] CIRCUIT AND METHOD FOR RETAINING DRAM CONTENT

[75] Inventor: Seiichi Abe, Odawara, Japan

[73] Assignee: Hitachi, Ltd., Tokyo, Japan

[21] Appl. No.: 467,277

[22] Filed: Jun. 6, 1995

[30] Foreign Application Priority Data

Jun. 7, 1994 [JP] Japan ................................. 6-125377

[51] Int. Cl.$^6$ .................................................. G11C 7/00
[52] U.S. Cl. ........................ 365/222; 365/226; 365/229
[58] Field of Search .................................... 365/229, 228, 365/226, 222

[56] References Cited

U.S. PATENT DOCUMENTS

| 4,631,701 | 12/1986 | Kappeler et al. | 365/222 |
|---|---|---|---|
| 4,962,485 | 10/1990 | Kato et al. | 365/229 |
| 5,204,840 | 4/1993 | Mazur | 365/229 |
| 5,245,582 | 9/1993 | Kimura | 365/229 |

FOREIGN PATENT DOCUMENTS

| 53-105935 | 9/1978 | Japan . |
|---|---|---|
| 60-72012 | 4/1985 | Japan . |
| 62-23349 | 2/1987 | Japan . |
| 4-178553 | 6/1992 | Japan . |
| 4-289582 | 10/1992 | Japan . |

OTHER PUBLICATIONS

Patent Abstracts of Japan, Publication No. JP6251581, Sep. 9, 1994, vol. 18, No. 654.
Patent Abstracts of Japna, Publication No. JP7045066, Feb. 14, 1995, vol. 950, No. 2.
Patent Abstracts of Japan, Publication No. JP7085660, Mar. 1995, vol. 950, No. 3.
Patent Abstracts of Japan, Publication No. JP4111295, Apr. 13, 1992, vol. 16, No. 361.

*Primary Examiner*—David C. Nelms
*Assistant Examiner*—Vu A. Le
*Attorney, Agent, or Firm*—Fay, Sharpe, Beall, Fagan, Minnich & McKee

[57] ABSTRACT

For a DRAM provided with a self-refreshing function, self-refresh starting operations and execution of the self-refresh mode are performed when the power supply voltage is cut off thereby achieving battery backup of the DRAM. This is achieved by detecting when the power supply voltage is at the lowest voltage at which normal data transfer can be performed. The operations carried out by the DRAM control circuit relate to stopping transfer of the following data after completing any transfer that was in the course of execution, executing refreshing, and establishing the self-refresh mode. All except for the last function are preceding processes for self-refreshing. Then, when the voltage of the power supply is determined to be in the proximity of the lowest voltage at which the DRAM drive circuit can perform normally, the drive circuit is disabled and the RAS and CAS signals of the drive circuit go low by means of pull-down resistors so that the self-refresh mode is established.

19 Claims, 3 Drawing Sheets

CIRCUIT AND METHOD FOR RETAINING DRAM CONTENT

FIELD OF THE INVENTION

The present invention relates to a memory control circuit having a DRAM and, more particularly, to a control circuit retaining the content stored in a DRAM having a self-refreshing function with the use of an auxiliary power supply when the main power supply is cut off.

BACKGROUND OF THE INVENTION

As a control circuit for retaining the content stored in a CMOS memory or the like with the use of an auxiliary power supply, there is known a memory control circuit utilizing an output signal of a power supply monitor to protect the memory by means of a circuit causing the chip select signal of an SRAM to go high to thereby disable the memory when the power supply is cut off. As a known example of the described type, there is for example one disclosed in the gazette of Japanese Utility Model Laid-open No. Sho 62-23349.

SUMMARY OF THE INVENTION

In the above described prior art, the content stored in an SRAM is retained while consuming a small amount of power and, with such an SRAM, the disabling control can be achieved in a short period of time of tens of ns when the power supply voltage is lowered. However, the prior art method is directed to an SRAM and no disclosure is provided about how to retain the content stored in a DRAM with an auxiliary power supply when the power supply voltage is lowered by having the DRAM provided with a self-refreshing function or a method to carry out self-refresh starting operations taking several μs in a stabilized manner to retain the content of storage. Further, in the case where the content stored in a DRAM provided with a self-refreshing function is retained with the use of an auxiliary power supply, the RAS signal and the CAS signal as the outputs of the DRAM drive circuit must be held low while the stored content is retained with the auxiliary power supply. However, since an SRAM is disabled by a high-level signal according to the prior art, there is not known any method for bringing the RAS signal and the CAS signal of a DRAM drive circuit to low level with a small amount or number of circuit components.

An object of the present invention is to solve the above mentioned problems, i.e., to provide a memory control circuit capable of reliably carrying out self-refresh starting operations to establish a self-refresh mode for a DRAM when the power supply voltage is lowered and, further, to easily realize a self-refresh mode consuming small power at the time when the power supply voltage is lowered with the use of a simple circuit configuration formed of a small number of circuit components.

In order to achieve the above mentioned object, the present invention provides a memory control circuit having a DRAM, a drive circuit for driving the DRAM, a DRAM control circuit for controlling operation of the DRAM through the drive circuit, a power supply, a first detection circuit (first power supply monitor) for generating a first detection signal when the power supply voltage is lowered to a voltage higher than the lowest power supply voltage at which data transfer for the DRAM can be performed normally, and a second detection circuit (second power supply monitor) for generating a second detection signal when the power supply voltage is lowered to a voltage equal to or slightly higher than the lowest power supply voltage at which the DRAM control circuit can operate normally. When the first detection signal is detected, the DRAM control circuit starts self-refreshing and completes the relative preceding processes and then, when the second detection signal is detected, the drive circuit establishes a self-refresh mode for the DRAM.

According to the invention, when the power supply voltage is lowered to a voltage slightly higher than the lowest power supply voltage at which data transfer for the DRAM can be performed, the DRAM control circuit (adapted to be operative at a voltage lower than the power supply voltage at which data transfer can be performed normally) is caused to start the self-refreshing function by a first detection signal. As a result, necessary preceding processes (to completely finish the data transfer being executed and stop the following transfer as well as cause the refreshing function to be executed and the self-refresh mode to be established) can be performed well by the DRAM control circuit. Then, when the power supply voltage is further lowered and tends to drop below the voltage at which the DRAM control circuit can operate normally, the outputs (RAS signal and CAS signal) of the drive circuit are brought to a low level by a second detection signal. Thereby, the RAS signal and the CAS signal are held low while the content stored in the DRAM is retained by the auxiliary power supply and thus the self-refresh mode is maintained.

Since the drive circuit is made up of a general drive circuit having a normal output impedance that is high and having extra pull-down resistors, a logic circuit is not required and the number of component parts can be reduced.

DETAILED DESCRIPTION OF THE PREFERRED EMBODIMENTS

An embodiment of the invention will be described below in detail with reference to the accompanying drawings.

Figure 1:
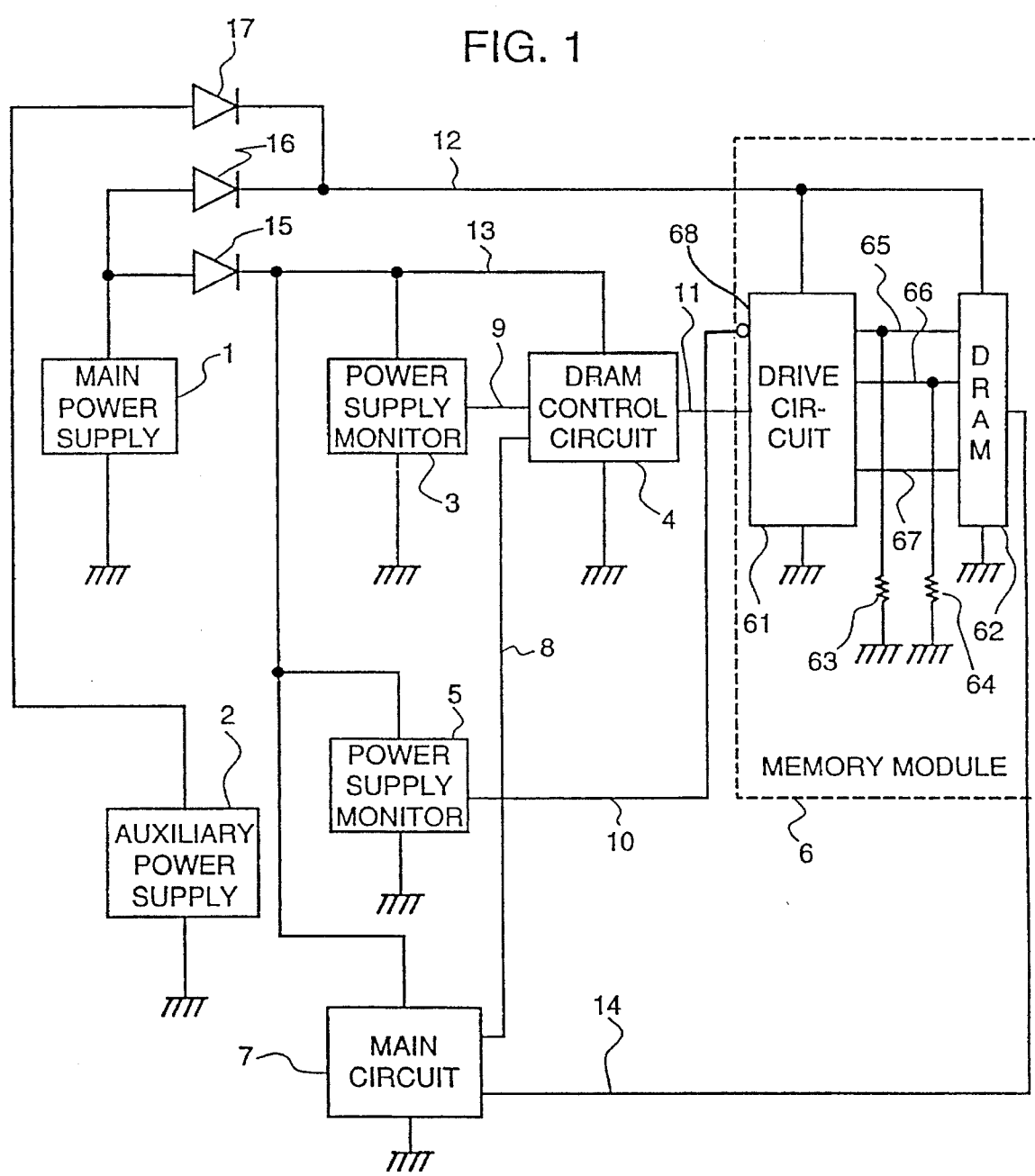
FIG. 1 is a block diagram of a first embodiment of the memory control circuit of the invention.

FIG. 1 is a block diagram of a memory control circuit of a first embodiment of the invention. Referring to the figure, the system comprises a main power supply 1 such as a commercial power supply, main battery power supply or the like, an auxiliary power supply 2 such as a battery or the like, a main circuit 7, a DRAM control circuit 4, a memory module 6, a first power supply monitor 3 and a second power supply monitor 5. Memory module 6 is made up of a drive circuit 61, a DRAM 62, and pull-down resistors 63 and 64. A power supply line 12 supplies power to the memory module 6 and a power supply line 13 supplies power to the main circuit 7 (CPU). A data bus 14 is connected between main circuit 7 and DRAM 62. Output lines of the drive circuit 61 are denoted by 65, 66, and 67, of which 65 denotes a RAS signal, 66 denotes a CAS signal, and 67 other DRAM control signals such as an address signal, a write enable signal, and an output enable signal.

The main power supply 1 supplies power required for system operation. The auxiliary power supply 2 supplies power for retaining the memory content of the DRAM in the case of the main power supply being cut off. Diodes 17 and 16 are used for switching power from the main power supply 1 and the auxiliary power supply 2 to be supplied to the power supply line 12 for the memory module 6. In normal operation, the voltage of the main power supply 1 is higher than the auxiliary power supply 2 and power is supplied from the main power supply. When the main power supply is cut off, the voltage of the main power supply 1 becomes lower than the auxiliary power supply 2 and power is supplied from the auxiliary power supply. A diode 15 keeps the power supply line 13 for the main circuit and the power supply line 12 substantially at the same potential.

The first power supply monitor 3 sets its detection voltage at a voltage Vt1 which is slightly higher than the minimum voltage at which the main circuit 7 can normally perform data transfer for the DRAM. The second power supply monitor 5 sets its detection voltage at a voltage Vt2 which is slightly higher than the minimum voltage at which the DRAM control circuit 4 can normally operate. The reason why the voltages Vt1 and Vt2 are set slightly higher than the respective minimum voltages (lowest voltages) is for ensuring, as described later, that processes to be performed preceding the establishment of the self-refresh mode are performed well by the DRAM control circuit 4.

Figure 2:
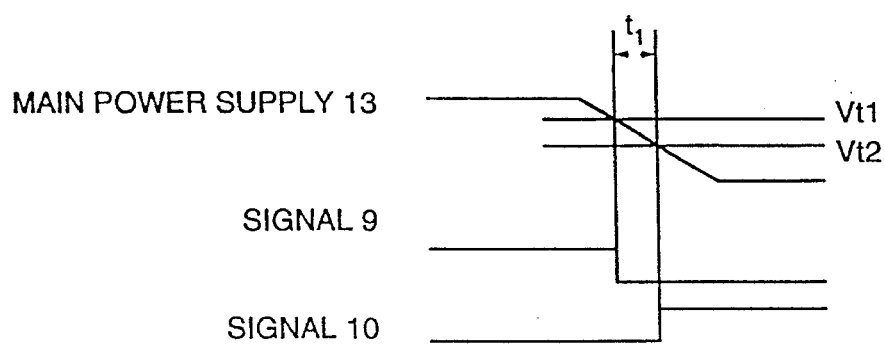
FIG. 2 is a timing chart when the main power supply is cut off in the first embodiment.

FIG. 2 is a diagram showing the timing of each signal when the main power supply is cut off or switched over in the embodiment of FIG. 1. At this time, the voltage on the power supply line 13 for the main circuit changes as shown in FIG. 2. Further, when the main power supply is switched over, output signals 9 and 10 of the power supply monitors 3 and 5 change as shown in FIG. 2 at the timing corresponding to the changes in voltage on the power supply line 13. The DRAM control circuit 4, when the output signal 9 of the first power supply monitor 3 is at high level, performs usual DRAM refreshing control and further controls the DRAM control signal 11 in response to the memory access control signal 8 from the main circuit 7.

Figure 4:
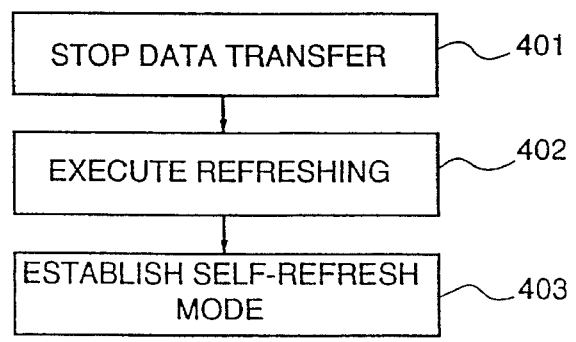
FIG. 4 is a sequence diagram of self-refresh starting operations in the invention.

When the output signal 9 is at low level, self-refresh starting operations are performed as shown in FIG. 4, i.e., the following data transfer is stopped after a data transfer being executed has been completed (step 401). Then, refreshing is executed (step 402), and the self-refresh mode is established (step 403). The refreshing operation in step 402 is an operation uniquely required of a DRAM and a necessary process to be performed prior to the establishment of the self-refresh mode in step 403. The self-refresh starting operations are commenced at the timing of the fall of the signal 9 in FIG. 2. Since the self-refresh starting operations are completed at the timing of the rise of the signal 10 in FIG. 2, the output signal 10 of the second power supply monitor 5 is allowed to function as a self-refresh start execution signal.

Drive circuit 61 is performs the following operations according to the state of the signal 10. Namely, when the output signal 10 is at a high level, the drive circuit 61 has its output circuit exhibiting a high impedance (on the order of $M\Omega$) irrespective of the DRAM control signal 11. On the other hand, when the output signal 10 is at a low level, the drive circuit 61 outputs a signal at the same level as the DRAM control signal 11 and drives the DRAM with it. Since the output signal lines for the RAS signal 65 and the CAS signal 66 are loaded with pull-down resistors 63 and 64 (load resistors whose resistance values are lower than the output of the high impedance value), the RAS signal and the CAS signal are held low when the output signal 10 is at high level. When both the RAS signal and the CAS are low, it means that the self-refresh mode is set up and the self-refresh mode of operation is maintained while both the signals are held low.

As apparent from the above, the signal 9 is the signal used for stopping the data transfer (step 401) and executing the refreshing (step 402) as processes to be performed prior to establishment of the self-refresh mode when the main power supply is cut off. Further, signal 10 is the one used for establishing and maintaining the self-refresh mode. Since, at this time, the DRAM control circuit 4 is adapted to be operative at a power supply voltage lower than its normal operating voltage, it can operate for some period of time during which the voltage on the line 13 gradually lowers as the result of the main power supply being cut off and hence it is ensured that the preceding processes (step 401 and step 402) are surely performed.

In one case, wherein the main power supply 1 is a conventional power supply (110 volts), the pull-down resistors 63 and 64 are set to be around 10 $\Omega$ or, when they cannot be set to such a low value depending on the capability of the drive circuit, they can be set to 100 $\Omega$ or above. In another case, the main power supply 1 can be a main battery power source for a portable device, for example, in which case the pull-down resistors 63 and 64 are set to be around 1k $\Omega$. Further, since the drive circuit 61 has an impedance higher than that of an ordinary driver in operation, it is vulnerable to crosstalk noise. In order to keep it from being effected by the crosstalk noise, other signal lines having changes when the main power supply is cut off or turned on should not be wired in parallel with (within 0.1 mm) the DRAM state control signals.

In the structure of FIG. 1, in order that the DRAM control circuit 4 operates at a power supply voltage lower than the set voltage Vt1 of the power supply monitor 3, it has a CMOS design or the like such that no problem with the timing margin arises (such that there is sufficient timing margin even when the lower voltage is set to Vt2). Thus the self-refresh starting operations are performed reliably and steadily.

According to the embodiment, since the DRAM control circuit 4 is structured to be operative at voltage down to the voltage Vt2 lower than the voltage at which data transfer is normally performed when the main power supply is cut off, it is ensured that the self-refresh starting operations (FIG. 4) are performed without fail in response to the detection signal 9 (the self-refresh starting signal) output by the first power supply monitor, i.e., the transfer of the following data is stopped after the data being transferred has been normally transferred, the refreshing is executed, and the self-refresh mode is established. Thus, when the main power supply is cut off, power of the backup auxiliary power supply 2 is only required to be supplied to the DRAM circuit of (memory module 6) made up of the DRAM 62 and the drive circuit 61. The backup auxiliary power supply 2 is not required to be supplied to other circuits such as the DRAM control circuit 4 (power is required to be supplied also to the DRAM control circuit 4 in the ordinary refresh mode). Accordingly, data can be held and stored for a long time with low consumption of power supplied by the auxiliary power supply 2. When the power supply voltage is further lowered below the lowest voltage at which the DRAM control circuit 4 can normally operate (around Vt2), the self-refresh mode is established with the RAS signal 65 and the CAS signal 66 brought to low levels by the detection signal 10 of the second power supply monitor 5.

Figure 5:
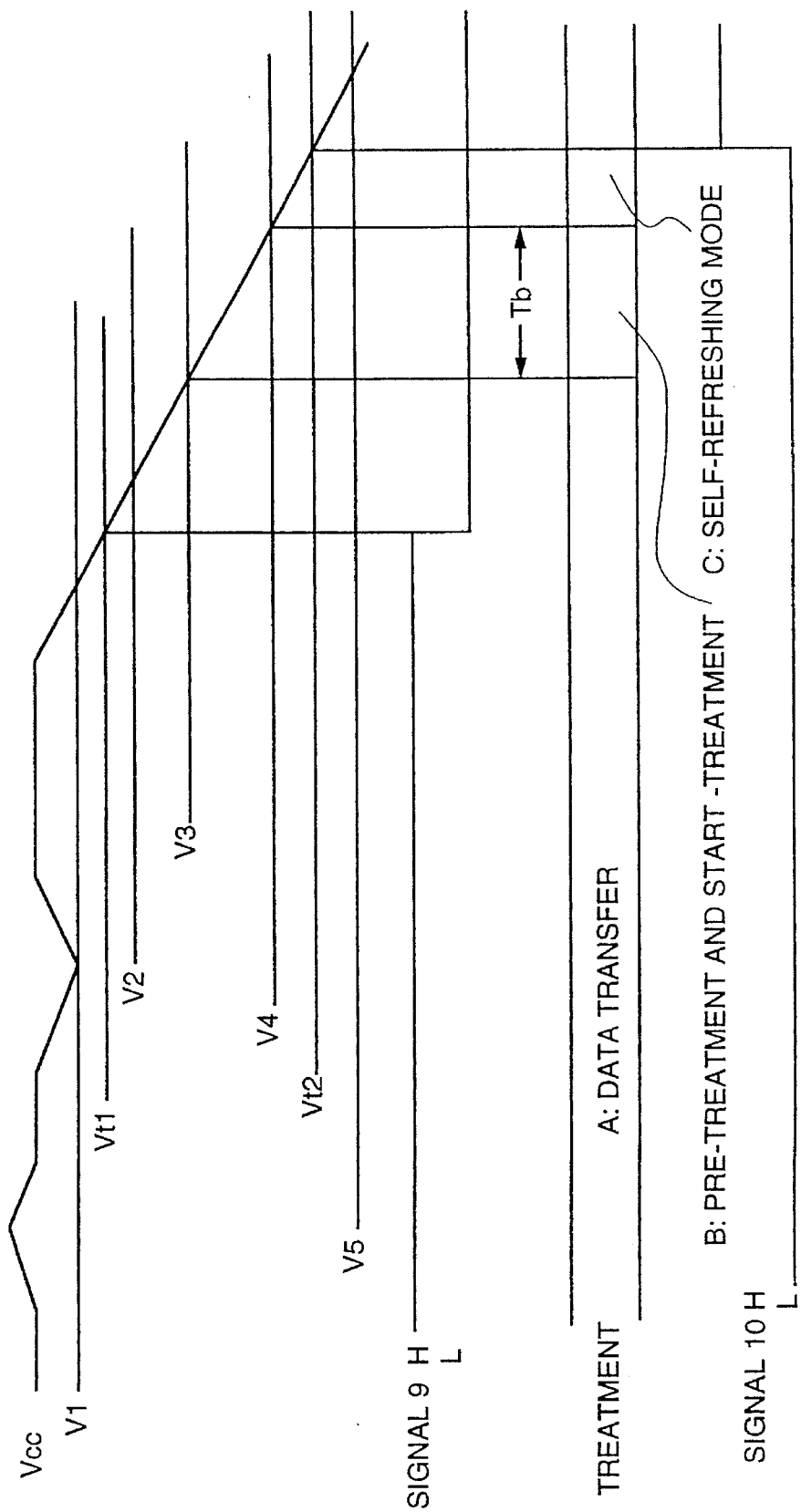
FIG. 5 is a timing chart similar to FIG. 2 showing the correspondence between various voltage levels and the timing of the establishing of the self-refresh mode of a DRAM.

FIG. 5 shows the correspondence between the setting of the threshold voltages Vt1 and Vt2 and the voltages V1–V5, explained as follows. First, Vcc is the operating voltage supplied by the main power supply 1, which is 5.0 V (nominal) and which fluctuates by ±3%, or ±0.15 V from 4.85 V to 5.15 V. V1 is the lowest voltage normally supplied by the main power supply, which is 4.85 V. V2 is a minimum voltage value that relates to the data through rate and data transfer rate of the DRAM, because at V2, the data transfer will still successfully terminate if a data transfer operation is occurring when the supply voltage Vcc is cut off. V3 is a voltage value that is the lowest value at which the CPU can still function, so the data transfer must be successfully completed before the voltage drop along the curve shown in the figure reaches V3. If the data through rate is Tsr (ms/V) and the data transfer rate or time to complete one transfer cycle is Ttr (s), then:

$$V2=V3+(Ttr/Tsr).$$

V4 is a voltage value at the lowest voltage above which the self-refreshing pretreatment function unique to DRAMs can be completed and the self-refreshing mode can be executed (Pretreatment & Start-treatment B, which is completed in elapsed time of Tb). Accordingly, V4 is related to Vt1, Ttr, Tsr and Tb as follows:

$$V4=Vt1-(Ttr+Tb)/Tsr.$$

V5 is a voltage value at the lowest voltage above which the DRAM control circuit 4 still executes correctly. In view of the above, the threshold voltages Vt1 and Vt2 are set in consideration of the following:

$$V2 \leq Vt1 \leq V1; \text{ and } V5 \leq Vt2 \leq V4.$$

Reference is made to a specific example for purposes of illustration, but not for the purpose of limiting the scope of the embodiments of the invention. Suppose that V1 is 4.85 V, Tsr is 1.0 (ms/V), Ttr is 10 µs and V3 is 4.5 V, then: V2=4.51 V and Vt1 ranges between 4.51 V and 4.85 V. Further, if Vt1 is selected to be 4.60 V, Tsr is 1.00 (ms/V) and Tb is 50 µs, then V4 is 4.54 V. So, according a referred embodiment, if V5=4.5 V, then Vt2 is selected to be between 4.5 V and 4.54 V, or preferably 4.5 V. Although Vt1 and Vt2 are selected to be within the above stated ranges, the difference between the respective voltage values must be at least 1.0 nV (nanovolt). Further, according to another example, Vcc may be 3.3 V (nominal), not 5.0 V as discussed above.

For a DRAM designed by an ASIC (application specific IC) technique, the CPU can execute correctly above 2.7 V, which is lower than the minimum CPU operating voltage V3, assumed above. Further, for a well designed circuit, the DRAM control circuit can operate at a voltage as low as V5=1.3 V. Still further, the Tsr can be set to 100 (ms/V) or other values in consideration of the condenser and resistor element determined time constants, and Ttr may also be of a different value, such as 1 ms by executing a packet transfer mode, and it may even be several hundred ns, for example, when the circuit does not adopt a high speed page mode.

In the present embodiment, the drive circuit operating as described above can be realized by a simple circuit formed of only a combination of drive circuit 61 and pull-down resistors 63 and 64. Characteristic of the drive circuit 61 of the present invention is that in addition to performing the usual functions, the drive circuit is also provided with an enable pin 68, unlike conventional drive circuits. In response to the active low enable pin 68 receiving a high output signal 10 from power supply monitor 5, the output impedance of the drive circuit becomes high enabling the RAS and CAS to be pulled low by pull-down resistors 63 and 64.

Figure 3:
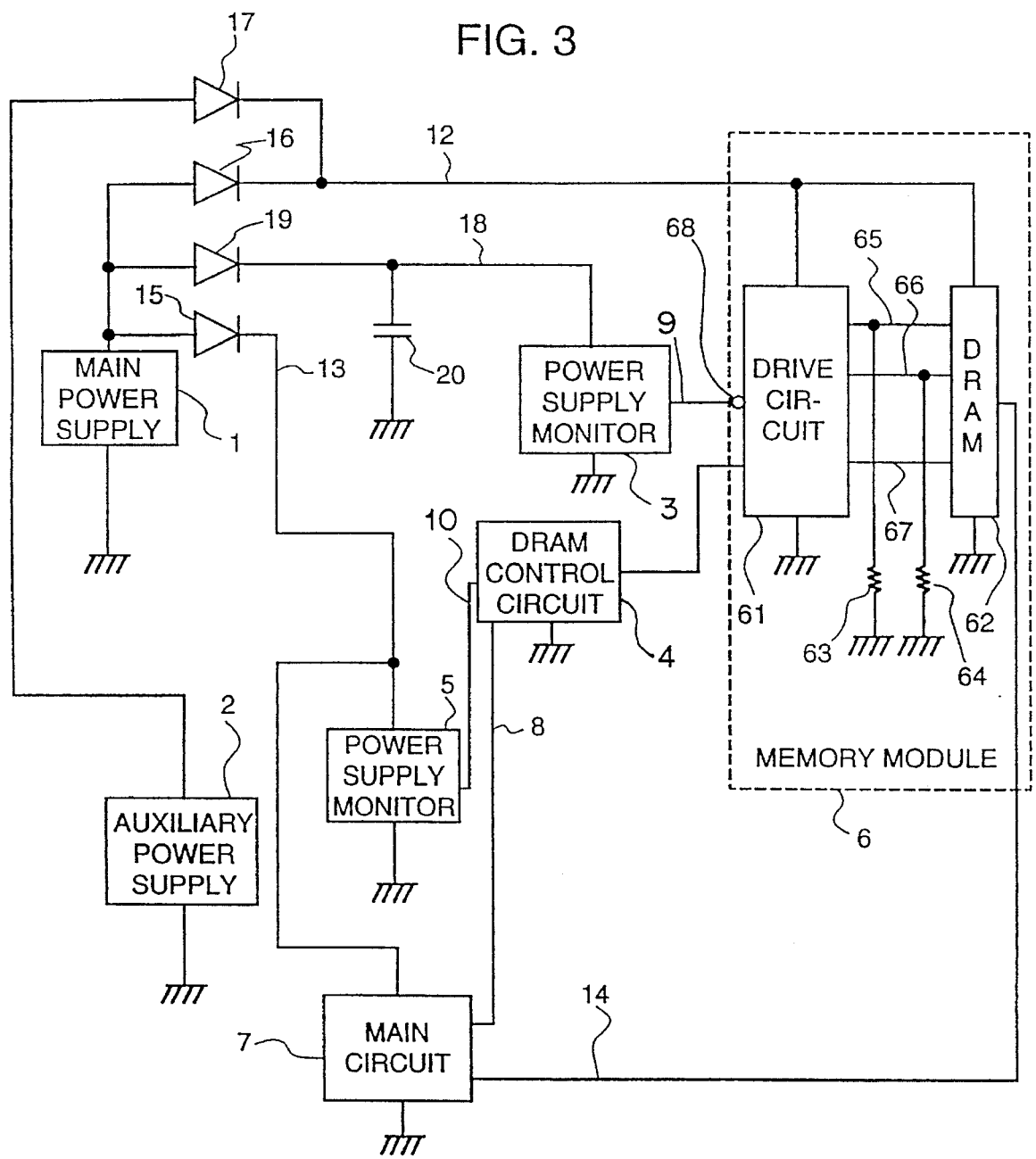
FIG. 3 is a block diagram of a second embodiment of the memory control circuit of the invention.

FIG. 3 is a block diagram of a memory control circuit of a second embodiment of the invention. Since certain of the components of the circuit of FIG. 3 are similar to those shown in FIG. 1 and since they are denoted by like reference numerals, their description will be omitted.

In the second embodiment, there is provided a power supply line 18 for the DRAM control circuit 4 separately from the power supply line 13 for the main circuit 7. Power supply line 18 is connected, as shown to a diode 19 and a capacitor 20. With this structure, the voltage drop at the time of the main power supply being cut off is delayed by the capacitor 20 and the self-refresh starting operations are thereby performed in a stabilized manner.

Although it is designed in the first and second embodiments that the RAS signal and CAS signals are brought to a low level by a combination of the drive circuit 61 whose output impedance becomes high when the signal 10 is output thereto and the pull-down resistors 63 and 64, or a logic circuit may, instead, be provided in the drive circuit 61 bringing the RAS signal 65 and the CAS signal 66 to low level when the signal 10 is output. Further, while the detection signal 10 of the second power supply monitor 5 is used for maintaining the self-refresh mode in the above embodiments, a signal equivalent to the signal 10 may, instead, be generated from the output signal 9 of the first power supply monitor 3. For example, the signal 10 may be obtained by delaying the signal 9 for a predetermined period of time t1 (the period of time necessary for executing steps 401 and 402).

Further, the invention may be carried out in the following modes of operation.

(1) In the memory control circuit, there is provided a DRAM control circuit performing its normal operation at a power supply voltage lower than the set voltage of the first power supply monitor.

(2) In the memory control circuit, there is provided a power supply voltage holding circuit holding the power supply voltage for the DRAM control circuit at its normal operating voltage until the DRAM control circuit establishes the self-refresh mode when the main power supply voltage is lowered below the set voltage of the first power supply monitor.

(3) In the memory control circuit, there is provided a DRAM control signal drive circuit whose output impedance is set to a high impedance value by a setting signal for establishing the self-refresh mode and there are provided pull-down resistors for the output circuit of DRAM state control signals (RAS signal and CAS signal) on the output side of the DRAM control signal drive circuit.

(4) In the memory control circuit, there is provided a logic circuit within the DRAM control signal drive circuit, the logic circuit bringing the DRAM state control signals (RAS signal and CAS signal) to low level with a setting signal for establishing the self-refresh mode.

(5) In the memory control circuit described in the mode of operation (3) above, there are provided a memory module having the DRAM control signal drive circuit combined with pull-down resistors and a DRAM incorporating the self-refreshing function integrally mounted thereon.

(6) In the memory module described in the mode operation (5) above, the resistance values of the pull-down resistors provided for the output circuit of the DRAM state control signals are set to be higher than 100 Ω and the level of the output circuit is held low while the main power supply is cut off, and the wiring pattern is designed such that other signal lines whose signal levels change when the main power supply is cut off or the main power supply is turned on are not wired in parallel with (within 0.1 mm) of the output circuit of the DRAM state control signals.

(7) There are provided a main power supply and an auxiliary power supply, of which the main power supply is supplied to the DRAM and the drive circuit and also to other circuits including the DRAM control circuit and the auxiliary power supply is supplied only to the DRAM and the drive circuit as backup power supply at the time when the main power supply is cut off or lowered.

According to the present invention, as described above in detail, a first detection signal is detected while the power supply voltage is lowered but yet while data transfer is being performed normally and the DRAM control circuit is operating normally, so that it is thereby made sure that the DRAM control circuit is caused to surely perform preceding processes well (such as to have data transfer being executed transmitted completely, to stop the following data transfer, to execute refreshing, and to establish a self mode), and when the power supply voltage tends to fall, or has fallen, below the voltage at which the DRAM operates normally, a second detection signal is detected and the drive circuit is caused by the detection signal to set up and maintain the self-refresh mode for the DRAM. Accordingly, the complicated self-refresh starting operations of the DRAM including the aforesaid preceding processes can be carried out surely and stably. Further, by the present invention, the drive circuit outputs (RAS signal and CAS signal) can be brought to low level when the main power supply is cut off with the use of a small number of component parts.

I claim:

1. A memory control circuit comprising a DRAM, a drive circuit for driving said DRAM, a DRAM control circuit for controlling operation of said DRAM through said drive circuit, a power supply connected to said DRAM, said DRAM control circuit and said drive circuit, a first detection circuit for generating a first detection signal that is output to said DRAM control circuit when the power supply voltage is lowered to a first predetermined voltage, and a second detection circuit for generating a second detection signal that is output to said drive circuit when the power supply voltage is lowered to a second predetermined voltage lower than said first predetermined voltage, wherein said DRAM control circuit, when said first detection signal is received, starts self-refreshing and, when said second detection signal is received, said drive circuit establishes a self-refresh mode for said DRAM.

2. A memory control circuit according to claim 1, further including an auxiliary power supply that is connected to said drive circuit and said DRAM for providing power thereto after said power supply is cut off in order to provide sufficient power for maintaining said established self-refresh mode.

3. A memory control circuit according to claim 2, wherein said power supply is connected to said DRAM and said drive circuit through a power line having a first diode and wherein said auxiliary power supply is connected to said power line between said first diode and said DRAM and said drive circuit through a second diode for switching between supplying power from said power supply to supplying power from said auxilliary power supply over said power line.

4. A memory control circuit according to claim 1, wherein said drive circuit has an output circuit having a first impedance value when driving said DRAM that includes RAS and CAS output signals for controlling said DRAM, said RAS and CAS signals being connected to a pull down circuit, wherein when said second detection signal is received, said output circuit is switched from said first impedance value to a second impedance value higher than said first impedance value for pulling low said RAS and CAS signals with said pull down circuit to set the self refresh mode.

5. A memory control circuit according to claim 4, wherein said drive circuit includes an enable pin that receives said second detection signal for controlling the switching of the output circuit between said first and second impedance values.

6. A memory control circuit according to claim 2, further comprising a power line connecting said DRAM control circuit through a power line to said power supply, and a capacitor connected to said power line in parallel with said power supply.

7. A memory control circuit according to claim 6, wherein said first detection signal is connected to said power supply through a first diode, said power line is connected to said main power supply through a second diode, said DRAM and said drive circuit are connected to said to said power supply by another power line through a third diode and said auxiliary power supply is connected to said another power line between said third diode and said DRAM and said drive circuit through a fourth diode.

8. A memory control circuit, comprising: a main circuit, a DRAM, a drive circuit for driving said DRAM, a DRAM control circuit for controlling operation of said DRAM through said drive circuit, a first power supply supplying a power supply voltage to said main circuit, said DRAM, said DRAM control circuit and said drive circuit, a first detection circuit connected to said first power supply for monitoring the supply voltage and for generating a first detection signal that is output to said DRAM control circuit when the power supply voltage decreases below a first predetermined voltage, and a second detection circuit for generating a second detection signal that is output to said drive circuit when the power supply voltage is lowered to a second predetermined voltage lower than said first predetermined voltage, wherein said DRAM control circuit, when said first detection signal is received, stops data transfer and starts self-refreshing of said DRAM after completion of data transfer, means responsive to said second detection signal being received by said drive circuit for setting a self-refresh mode for said DRAM, and a second auxilliary power supply that is connected to said drive circuit and said DRAM for providing power thereto after said power supply voltage is cut off in order to provide sufficient power for maintaining said self-refresh mode.

9. A memory control circuit according to claim 8, wherein said self-refresh mode setting means comprises said drive circuit having an output circuit having a first impedance value when driving said DRAM that includes RAS and CAS output signals for controlling said DRAM and said RAS and CAS signals being connected to a pull down circuit, wherein when said second detection signal is received, said output circuit is switched from said first impedance value to a second impedance value higher than said first impedance value for pulling low said RAS and CAS signals with said pull down circuit to set the self refresh mode.

10. A memory control circuit according to claim 9, wherein said drive circuit includes an enable pin that receives said second detection signal for controlling the switching of the output circuit between said first and second impedance values.

11. A memory control circuit according to claim 8, further comprising said DRAM having a data through rate (Tsr) and a data transfer rate (Ttr), a minimum voltage level V1 supplied by said first power supply, a voltage value V2 and a voltage value V3 that is a minimum voltage at which data transfer can be completed, wherein V2=V3+(Ttr/Tsr) and said first predetermined voltage ranges between V1 and V2.

12. A memory control circuit according to claim 11, further comprising said drive circuit performing said stop of data transfer and start of self-refreshing of said DRAM in elapsed time Tb, a minimum voltage level V5 at which said DRAM control circuit still functions correctly and a voltage level V4, wherein V4=Vt1−(Ttr+Tb)/Tsr and said second predetermined voltage ranges between V4 and V5.

13. A memory control circuit according to claim 12, wherein a minimum difference between said first and second predetermined voltages is at least 1 nanovolt.

14. A memory module circuit, comprising:

a DRAM having a self refresh mode, a power supply line connected to said DRAM and to a drive circuit for driving said DRAM, said drive circuit including:

an output circuit which has a first impedance value during driving of said DRAM and a second impedance value, RAS and CAS output signals for controlling said DRAM, the RAS and CAS signals being connected to said DRAM, and an enable pin that receives an input signal for pulling low said RAS and CAS signals to establish said self refresh mode.

15. A memory module circuit according to claim 14, wherein:

said second impedance value is higher than said first impedance value, and said enable pin controls switching of said output circuit between said first and said second impedance values to establish said self refresh mode.

16. A memory module circuit, comprising:

a DRAM having a self refresh mode, a pull down circuit, a power supply line connected to said DRAM and a drive circuit for driving said DRAM, an output circuit which has a first impedance value during driving said DRAM and a second impedance value, RAS and CAS output signals for controlling said DRAM, the RAS and CAS signals being connected to said DRAM, and an enable pin that receives an input signal for pulling low said RAS and CAS signals to establish said self refresh mode.

17. A memory module circuit according to claim 16, wherein:

said second impedance value is higher than said first impedance value, and said enable pin controls switching of said output circuit between said first and said second impedance values to establish said self refresh mode.

18. A memory module circuit according to claim 16, wherein said pull down circuit is connected to said RAS and CAS output signals between said drive circuit and said DRAM for pulling low said RAS and CAS signals in response to said input signal being received at said enable pin.

19. A method for retaining DRAM content in a memory module circuit which comprises: a DRAM having a self refresh mode, a power supply line, and a drive circuit, wherein said power supply line is connected to said DRAM and said drive circuit, and said drive circuit drives said DRAM, said drive circuit having RAS and CAS output signals for controlling said DRAM and an enable pin that responds to an input signal for pulling low said RAS and CAS signals to establish said self refresh mode, comprising steps of:

monitoring and sending a first input signal to said drive circuit when said power supply voltage is determined to be less than a first predetermined reference voltage, refreshing said DRAM content when said drive circuit receives said first input signal, and monitoring and sending a second input signal to said enable pin to establish said self refresh mode when said power supply voltage is determined to be less than a second predetermined reference voltage which is lower than said first predetermined reference voltage.

* * * * *